United States Patent [19]
Turney et al.

[11] 4,334,185
[45] Jun. 8, 1982

[54] CIRCUIT FOR AUTOMATIC GAIN CONTROL WITH CONSTANT RESPONSE TIME

[75] Inventors: William J. Turney, Schaumburg, Ill.; Gregory H. Piesinger, Scottsdale, Ariz.

[73] Assignee: Motorola, Inc., Schaumburg, Ill.

[21] Appl. No.: 217,956

[22] Filed: Dec. 18, 1980

[51] Int. Cl.³ .............................................. G05F 1/44
[52] U.S. Cl. .................................... 323/280; 307/553; 307/562; 307/264; 330/284; 455/234; 455/249
[58] Field of Search ...................... 307/264, 553, 562; 323/280; 330/278, 279, 282, 284; 455/234, 240, 245, 250, 249

[56] References Cited
U.S. PATENT DOCUMENTS

| | | |
|---|---|---|
| 3,002,090 | 9/1961 | Hirsch . |
| 3,302,117 | 1/1967 | Smith et al. . |
| 3,394,315 | 7/1968 | Gray . |
| 3,704,421 | 11/1972 | Blane . |
| 3,720,880 | 3/1973 | Le Seigneur . |
| 3,790,896 | 2/1974 | Shimizu et al. ................. 307/264 X |
| 3,808,547 | 4/1974 | Kinkel . |
| 3,895,299 | 7/1975 | Tiedeman, Jr. . |
| 3,895,310 | 7/1975 | Warren . |
| 3,983,505 | 9/1976 | Ishigaki et al. . |
| 4,031,504 | 6/1977 | Mioduski . |
| 4,048,566 | 9/1977 | Carson et al. . |
| 4,099,024 | 7/1978 | Boggs et al. . |
| 4,225,976 | 11/1980 | Osborne et al. . |
| 4,234,853 | 11/1980 | Yamaguchi ..................... 330/279 X |
| 4,236,116 | 11/1980 | Beseke et al. ................... 307/264 X |

Primary Examiner—William M. Shoop
Attorney, Agent, or Firm—Donald P. Reynolds; Edward M. Roney; James W. Gillman

[57] ABSTRACT

A circuit for automatic gain control of a feedback system in a time that is essentially constant regardless of the signal level includes a device for producing a signal that is representative of the output of the circuit. The signal is compared with a fixed reference to determine an error signal. The error signal is multiplied by its own time integral to obtain a control signal for a weighter that is cascaded with an amplifier to provide a controlled forward path. By this means, gain of the controlled forward path is controlled within a time that is substantially independent of signal strength.

5 Claims, 2 Drawing Figures

CIRCUIT FOR AUTOMATIC GAIN CONTROL WITH CONSTANT RESPONSE TIME

BACKGROUND OF THE INVENTION

This invention relates to automatic gain control (AGC) in systems using feedback. In particular, it is a method and means of achieving AGC with a substantially constant response time over a relatively wide dynamic range. This is of especial importance in radio receivers in which a signal must typically be controlled over a wide dynamic range, and it has applications in other control systems.

The normal operation of radio receivers calls for the development of an output signal that is constant in level despite variations in the level of the carrier of a received signal. A properly designed receiver will leave the listener unaware of most of the fading or other variations that may occur in a signal to which he is tuned, and it will also leave him unaware of differences in the average received signal strengths of the carriers of different stations to which he may tune. To accomplish these objectives, it is customary to apply AGC to a receiver. This is a feedback system that adjusts the gain of one or more elements in a circuit in response to the level of the carrier in the system. In most such systems, gain is essentially an exponential function of the amplitude of the feedback signal. If the controlled amplifier is a bipolar transistor, the gain is essentially an exponential function of the average value of the base-emitter voltage. However, there are disadvantages that can arise from applying ACG to transistors. When AGC is applied to an amplifier, the input and output impedances of the amplifier are normally changed from their values without AGC. The introduction of AGC may also lead to instability in a transistor stage. A further disadvantage is the fact that changing the operating point of a transistor amplifier may increase the distortion produced by intermodulation in the amplifier. All of the effects listed above are disadvantages that must be overcome. One way of overcoming these disadvantages is to connect a controlled variable attenuator in cascade with an amplifier having fixed gain, and applying feedback control to the variable attenuator. However, this creates the corresponding disadvantage of making the response time of the controller a strong function of the input signal level. This is the case with a PIN diode attenuator in which attenuation is a linear function of signal strength. It would be advantageous to keep the response time independent of signal strength.

It is an object of the present invention to provide a system of automatic gain control that has a substantially constant bandwidth.

It is a further object of the present invention to provide a system of automatic gain control that adjusts to a change in input in a time that is essentially independent of the size of the change.

Other objects will become apparent in the course of a detailed description of the invention.

SUMMARY OF THE INVENTION

A system for automatic gain control with a substantially constant bandwidth is achieved by placing a controllable weighter in cascade with an amplifier having a fixed gain. The carrier level or some other measure of the signal strength of the output of the amplifier is detected, and a signal proportional to the signal level is applied to a summer where it is compared to a reference voltage. A signal that is the difference between the reference voltage and the detected voltage is applied to a multiplier, and the output of the multiplier is integrated and taken as both a second input to the multiplier and a control signal to the weighter. The multiplier creates a non-linear response in a feedback network that causes the network to respond faster to large changes in carrier levels than it does to smaller changes, thus tending to produce a constant bandwidth for the system.

DETAILED DESCRIPTION OF THE INVENTION

Figure 1:
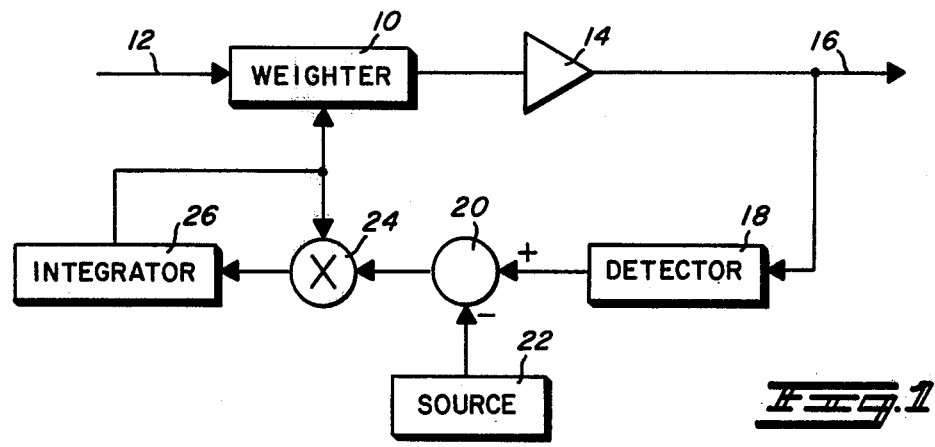
FIG. 1 is a functional block diagram of a circuit for the practice of the present invention.

FIG. 1 is a functional block diagram of a circuit for the practice of the present invention. In FIG. 1 a weighter 10 receives an input signal from an input line 12. The weighter is connected to an amplifier 14 which receives and amplifies the output signal from weighter 10. The output of amplifier 14 is taken on line 16 as the controlled output from the circuit and is also conducted to detector 18 which produces an output proportional to the signal level on line 16. The output of detector 18 is applied to comparator 20 in which a reference voltage from source 22 is subtracted from the output from detector 18. The difference signal is taken from comparator 20 to multiplier 24, and the multiplied signal is integrated in integrator 26. Multiplier 24 receives as a second multiplying input the output of integrator 26. That output is also taken to control the setting of weighter 10.

When the level of the signal at the output of amplifier 14 is not changing, the output of comparator 20 is zero, as is the output of multiplier 24. The output of integrator 26 is thus a constant, so that weighter 10 holds whatever setting it has had. if the level of the signal on line 12 increases, the signal on line 16 increases, increasing the output from detector 18. Comparator 20 will then produce a positive output which is multiplied in multiplier 24 by the integrated output of multiplier 24 to produce a signal as an input to weighter 10 that will attenuate the signal on line 12, reducing the input to amplifier 14 and hence its output. This change will continue until the output of comparator 20 drops to zero, when the circuit is again at its steady state. Operation of the circuit with a decrease in signal is similar, tending to restore the constant output level on line 16. The presence of multiplier 24 in the circuit of FIG. 1 increases the input to integrator 26 disproportionately for larger changes in signal level, thus driving the weighter 10 to restore equilibrium in the feedback network. The multiplier 24 introduces a nonlinearity that causes the network to return to equilibrium following a disturbance at a rate that is a function of the magnitude of the disturbance.

Figure 2:
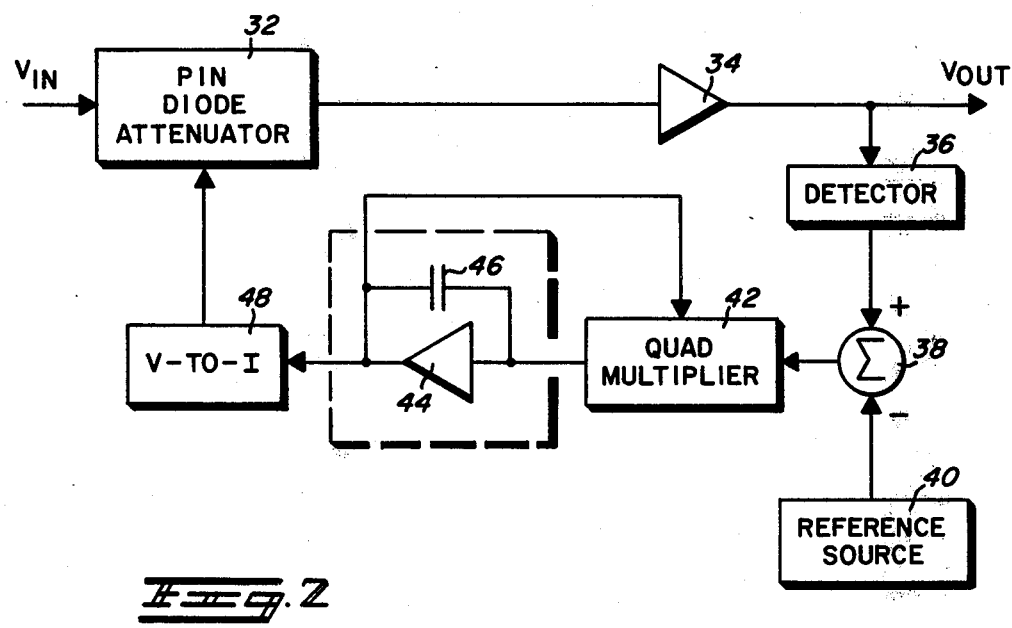
FIG. 2 is a diagram of a circuit for the practice of the present invention.

FIG. 2 is a circuit diagram of an apparatus for the practice of the present invention. In FIG. 2, a PIN diode bridge attenuator 32 receives an incoming signal $V_{in}$ and attenuates that signal according to a setting of the attenuator 32. Signal $V_{in}$ is typically a carrier that may be modulated with AM, FM or single sideband with at least a vestigial carrier, although it may equally as well be any continuous a-c signal. The output of attenuator 32 is amplified in amplifier 34 to become the output voltage $V_{out}$ of the circuit. That voltage is also applied to detector 36 which responds to DC or slowly varying portions of the output signal. The detected output of detector 36 is compared in summer 38 with an adjustable voltage from a reference source 40. The voltage of reference source 40 sets the overall gain of the circuit. This is the value to which the gain is controlled. The difference between the voltage from reference source 40 and that from detector 36 is applied to quad multiplier 42. The multiplied output of quad multiplier 42 is integrated by the combination of high-gain amplifier 44 and integrating capacitor 46 to generate an output that is taken as a second input to quad multiplier 42. Thus, the input to quad multiplier 42 from summer 38 is multiplied by its integral to produce an output. The integrated output of high-gain amplifier 44 is taken to voltage-to current converter 48 which generates a current proportional to the output of high-gain amplifier 42 to control the setting of PIN diode attenuator 32.

The circuit of FIG. 2 was built and operated at a frequency of 11.7 MHz. In that circuit the amplifier 34 was an FET amplifier having a gain of 23 dB. Detector 36 was a diode detector, and the summer 38 was an operational amplifier with differential inputs. Quad multiplier 42 was a linear four-quadrant multiplier that is a catalog item, and amplifier 44 and voltage-to-current amplifier 48 were operational amplifiers. With this circuit, over a variation of approximately 50 dB of attenuation, the weighter followed a characteristic that was close to linear. Specifically, the gain W of the weighter over that range was given by $W = KI^{(0.95)}$ where K is a static weighting constant. Using that weighter, the response of the circuit was obtained by measuring the 3-dB bandwidth as a function of the input power. The bandwidth was obtained by applying an RF signal with essentially 100% amplitude modulation by a pure sinusoid of varying frequency. For each level of input power the output of the integrator was monitored with a modulating signal well within the passband, and then the frequency of a modulating signal was increased until the measured value of the output of the integrator decreased by 3 dB. This provided a measure of the half-power bandwidth of the control circuit. The results of this measurement are shown in Table 1.

TABLE I

| Bandwidth as a function of input power for the circuit of FIG. 2 | |
|---|---|
| Input Power (dBm) | 3 dB Bandwidth (Hz) |
| −100 | 10.5 |
| −90 | 9.4 |
| −80 | 8.8 |
| −70 | 8.0 |
| −60 | 8.0 |

TABLE I-continued

| Bandwidth as a function of input power for the circuit of FIG. 2 | |
|---|---|
| Input Power (dBm) | 3 dB Bandwidth (Hz) |
| −50 | 8.0 |
| −40 | 8.0 |
| −30 | 7.9 |
| −20 | 7.9 |
| −10 | 7.8 |

An inspection of Table 1 shows that the bandwidth was constant to within 2% of its value over a range of input powers from −70 dBm to −10 dBm. For input power levels below −70 dBm, the bandwidth begins to increase at a moderate rate. In the absence of the circuit of the present invention, that bandwidth would have varied by a factor of about one thousand with a variation of the input signal from −10 dBm to −70 dBm.

I claim:

1. A circuit for automatic control of gain between an input terminal and an output terminal of a system having a continuous a-c signal at the input terminal, the circuit comprising:
   a weighter connected to the input terminal and receiving the continuous a-c signal therefrom, the weighter attenuating the continuous a-c input signal by a controlled amount;
   an amplifier connected to the weighter and to the output terminal and receiving from the weighter a signal that is amplified and delivered as an output signal to the output terminal;
   a detector connected to the output terminal and responsive to a measure of amplitude of the output signal to generate therefrom a detected signal;
   a controllable source of a predetermined reference electrical quantity;
   a comparator connected to the detector and the controllable source to produce an output that is the difference between the reference electrical quantity and the detected signal;
   a multiplier connected to the comparator and receiving as a first input the comparator difference output; and
   an integrator connected to the multiplier and the weighter, the integrator receiving as an input an output signal from the multiplier, the integrator producing an integrated output signal that is taken as a second input to the multiplier and as a control signal to the weighter to determine the controlled amount of attenuation of the weighter.

2. The circuit of claim 1 wherein the continuous a-c signal is an amplitude-modulated carrier.

3. The circuit of claim 1 wherein the continuous a-c signal is a frequency-modulated carrier.

4. The circuit of claim 1 wherein the continuous a-c signal is single sideband with a vestigal carrier.

5. The circuit of claim 1 wherein the weighter is a PIN-diode attenuator.

* * * * *